United States Patent [19]

Mayfield

[11] 4,055,804
[45] Oct. 25, 1977

[54] WATT/WATTHOUR TRANSDUCER AND AMPLIFIER-FILTER THEREFOR

[76] Inventor: Glenn A. Mayfield, 3060 Wilce Ave., Columbus, Ohio 43202

[21] Appl. No.: 686,457

[22] Filed: May 14, 1976

Related U.S. Application Data

[63] Continuation of Ser. No. 532,517, Dec. 13, 1974, abandoned.

[51] Int. Cl.$^2$ .................. G01R 21/06; G01R 11/32
[52] U.S. Cl. .............................. 324/142; 324/123 R; 330/69
[58] Field of Search .................... 324/123, 142; 321/9, 321/10; 330/30 D, 69; 328/165

[56] References Cited

U.S. PATENT DOCUMENTS

| | | | |
|---|---|---|---|
| 3,486,499 | 12/1969 | Yen | 324/123 R X |
| 3,502,911 | 3/1970 | Lehman | 330/30 D X |
| 3,532,983 | 10/1970 | Knanishu | 324/123 R |
| 3,723,766 | 3/1973 | Sordello | 330/30 D X |
| 3,794,917 | 2/1974 | Martin et al. | 324/142 |
| 3,816,765 | 6/1974 | Goyer | 330/30 D X |
| 3,818,340 | 6/1974 | Yamaguchi | 324/142 |
| 3,838,351 | 9/1974 | Hekimian | 330/69 X |
| 3,875,508 | 4/1975 | Milkovic | 324/142 |
| 3,900,794 | 8/1975 | Bell | 324/142 |
| 3,961,257 | 6/1976 | Milkovic | 324/142 |

OTHER PUBLICATIONS

Leighton, H. N. Controlled Linearity Phase Shifter, IBM Tech. Disc. Bull, vol. 14, No. 5, Oct. 1971, pp. 1402, 1403.

Smith, John I. Modern Operational Circuit Design, John Wiley and Sons, 1971, Chap VIII, pp. 64-75, TK7867.56.

Primary Examiner—Gerard R. Strecker
Attorney, Agent, or Firm—Frank H. Foster

[57] ABSTRACT

A watt/watthour meter of improved accuracy and relatively lower cost than a conventionally designed device with similar specifications. A current proportional to instantaneous power is obtained from a current-voltage multiplier circuit and is maintained as a current signal through amplifying and filtering, and through the watt output load. The watt output amplifier is a current input, current output amplifier which simultaneously functions as an active ripple filter. It directly couples the input signal to the inverting input and capacitively couples the input ripple to the non-inverting input of the amplifier's op-amp. The output load, which is externally connected between the inverting input and the output of the op-amp, does not have a common with the internal ground and effectively floats with the ripple.

6 Claims, 9 Drawing Figures

WATT/WATTHOUR TRANSDUCER AND AMPLIFIER-FILTER THEREFOR

This is a continuation of application Ser. No. 532,517 filed Dec. 13, 1974, now abandoned.

BACKGROUND OF THE INVENTION

The present invention relates generally to electrical power instrumentation and more particularly relates to a watt/watthour transducer for metering the rate and quantity of electrical energy transmission.

The conventional watt/watthour metering apparatus which is related to the present invention typically has voltage and current input scaling means for providing a signal proportional to power line voltage and signal proportional to power line current. These signals are applied to a multiplier circuit which provides an output signal having a value substantially proportional to the power or rate of energy flow through the power line.

Some systems, such as that shown in U.S. Pat. No. 3,794,917, have a multiplier which includes a pulse width modulating circuit. In such a circuit, one of the input signals or a signal proportional thereto is modulated by the other input signal or a signal proportional thereto. The output of such a pulse width modulator arrangement consists of a series of pulses having a height proportional to the instantaneous value of either the current or voltage in the power line and having a pulse width proportional to the instantaneous value of the other.

The average value of this series of pulses is proportional to the average instantaneous power of the power line. Consequently, the output of the modulator may be filtered and amplified to provide an output signal indicative of instantaneous power (actually power averaged over a very small time interval dependent upon the response time of the system which is typically less than a few seconds).

In addition, a signal proportional to the modulator output signal or the modulated output signal itself may be integrated with respect to time to provide a signal corresponding to watthours of energy through the power line over a given time interval. The present invention relates to improvements in watt/watthour metering apparatus.

It is conventional in a circuit of the above type to utilize voltage signals and voltage devices. This means that the information contained at various points in the circuitry is related to the voltage between particular nodes rather than to the current flow. Most circuits modulate the voltage related signal with the current related signal. This provides an output voltage having an average value approximately equal to the instantaneous power of the power line.

This average voltage is then conventionally filtered and amplified by a voltage amplifier and subsequently converted to a current signal by a high output impedance amplifier to provide a current source output to the watt output load, such as a recording device. Even in a circuit providing a modulator output current proportional to instantaneous power, the current signal is conventionally converted to a voltage signal by sinking it through a resistance and then this voltage signal is amplified.

One problem with such conventional circuits which depend upon one or more voltage signals is that the offset voltages of typical op-amps, drift and the voltage drops across various circuit elements such as the modulator cause considerable error. This error is a particular problem in equipment for which error tolerances must be kept within a percentage of reading rather than within a percentage of full scale because a small offset error may be a major portion of a small reading.

It is therefore an object of the invention to eliminate such voltage related error and to greatly improve the percent of reading accuracy of a watt/watthour transducer.

It is a further object of the invention to reduce the cost of a watt/watthour transducer by eliminating some components conventionally required and minimizing the number of elements while at the same time increasing the accuracy of such circuitry.

In conventional circuits the modulator output signal which is proportional to instantaneous power is filtered and amplifier by a series of cascaded stages. Ordinarily, these consist of a filter stage followed by a voltage amplifier. Thus, in a typical design each cascaded stage performs its own particular function. To Applicant's knowledge, active filters have not been used in watt-/watthour meters. Active filters are generally regarded as voltage input voltage output devices.

Therefore it is an object of the present invention to provide a current to current output amplifier for amplifying a power related current signal from the modulator and having output terminals not having a common with the internal ground.

It is another object of the invention to provide such a circuit which simultaneously exhibits both a ripple filter characteristic and a high output impedance amplifier characteristic without substantially increasing in the number of circuit elements or cost over that required for an amplifier alone.

It is another object of the invention to provide an output amplifier-filter circuit having extremely low offset, requiring no zero adjustment and exhibiting an excellent ripple response.

Further objects and features of the present invention will be apparent from the following specification and claims when considered in connection with the accompanying drawings illustrating the preferred embodiments of the invention.

SUMMARY OF THE INVENTION

The invention has a watt/watthour transducer in which a high impedance current source proportional to the voltage or current in a power line is pulse width modulated to provide an output current proportional to instantaneous power in the power line and in which this output current is maintained as a current signal through the watt section and watt output load. A combination current amplifier-filter circuit is utilized in the watt section and exhibits at least a two-pole filter characteristic. The amplifier-filter circuit uses a dc blocking capacitance to couple ripple signal to the non-inverting input of its op-amp.

Figure 1:
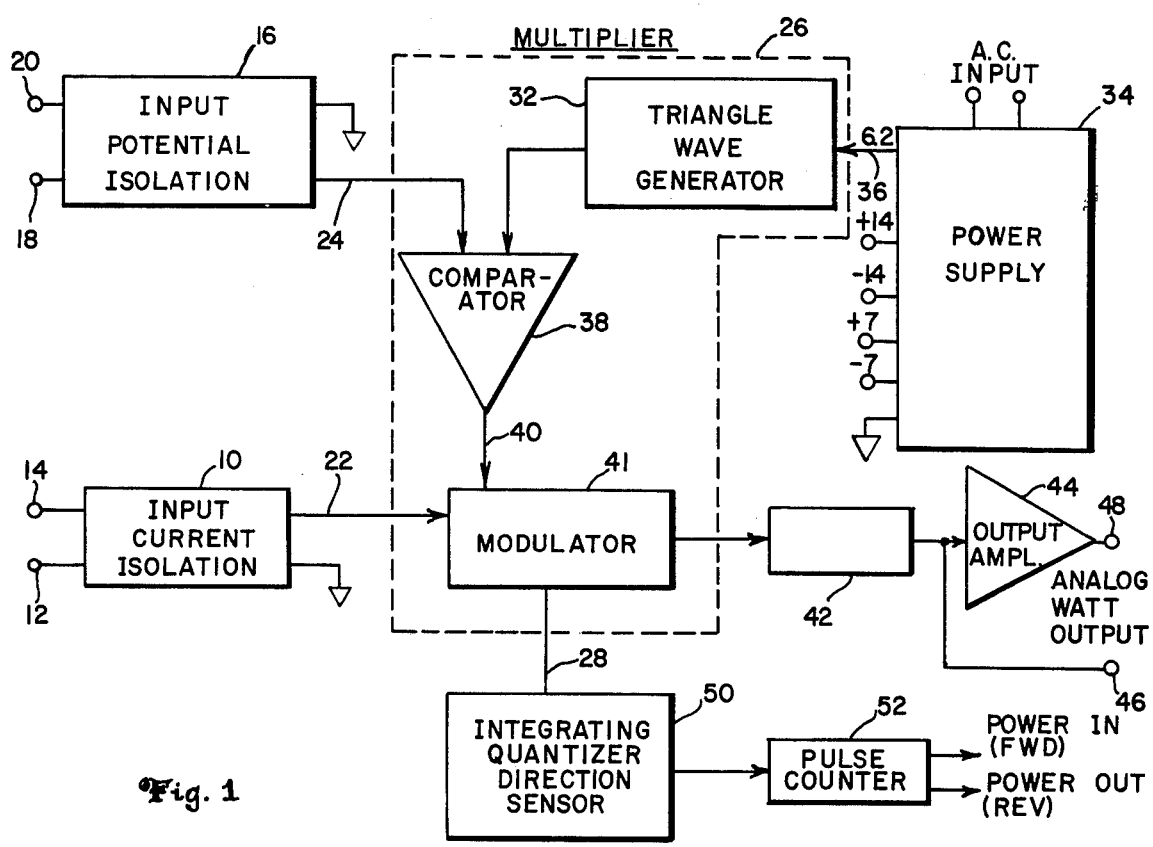
FIG. 1 is a block diagram of a complete watt/watthour transducer.

In describing the preferred embodiments of the invention illustrated in the drawings, specific terminology will be resorted to for the sake of clarity. However, it is not intended to be limited to the specific terms so selected and it is to be understood that each specific term includes all technical equivalents which operate in a similar manner to accomplish a similar purpose. For example, the terms "connected" or "coupled" may include connection through other circuit elements where such connection is recognized as equivalent and operates in essentially the same manner to accomplish the same purpose.

DETAILED DESCRIPTION

A watt/watthour transducer is a device for sensing the voltage and current in a power line, multiplying the voltage and current to obtain a watt output signal, and integrating a watt signal to provide a watthour output signal. Of course, when there is a power factor involved the multiplication must also include the cosine of the phase angle between the voltage and current.

FIG. 1 is a block diagram of the basic components of a watt/watthour metering system. Although FIG. 1 embodys the present invention the figure is so simplified that it differs very little from similar prior art systems.

Referring to FIG. 1, the system is isolated from the power line by means of an input scaling means connected to the power line and includes a current scaling means 10 having input terminals 12 and 14 which are series connected to the power line and a voltage scaling means 16 having input terminals 18 and 20 which are shunted across the power line. In this manner, a signal proportional to power line current is provided at the output 22 of the current scaling means 10 and a signal proportional to power line voltage is provided at the output 24 of the voltage scaling means 16.

Voltage scaling means 16 preferably comprises a potential input transformer which scales the power line voltage downward by a ratio of 120 to 1.4 to provide a nominal secondary voltage of 1.4 volts rms at the output 24 which is a replica of the power line voltage at the terminals 20 and 18. The input scaling means 10 preferably comprises a current transformer which typically scales the current down by a factor of 1000 to 1. Consequently, a 5 amp power line current would produce a 5 milliamp output current through the output 22 of the current scaling means 10.

These current and voltage signals are applied to a multiplier circuit 26 which in turn provides a signal proportional to power line power measured in watts at multiplier outputs 28 and 30. The preferred multiplier circuit accomplishes multiplication by means of pulse width modulation. In this system, the voltage or current signal is modulated by the other to provide an output train of pulses with amplitudes proportional to the amplitude of the modulated signal and a pulse width duration proportional to the modulating signal. The average value of this pulse train is proportional to power through the power line.

The preferred multiplier utilizes a triangle wave generator 32 referenced to a reference voltage derived by a power supply 34 at power supply output 36. The multiplier has a comparator 38 which compares the output of the triangle wave generator 32 with the scaled voltage signal at the output 24 of the voltage scaling means 16. The comparator output signal is applied as a modulating voltage to a chopper modulator 41 to modulate the scaled current signal from the output 22 of the current scaling means 10.

The triangle wave generator 32 develops a triangular waveform which is preferably approximately 5.9 volts peak to peak and centered around ground. The scaled voltage signal is compared to the signal from the triangle wave generator 32 resulting in a pulse train from the comparator output 40 having an average frequency equal to the frequency of the triangle wave which is preferably approximately 600 hz. The width of these pulses is proportional to the input voltage from the power line and their amplitude is of no consequence because the pulses are used to switch the chopper modulator 41. Thus, the triangle wave generator and comparator function together as an analog to pulse width convertor.

Multipliers of this general type for providing a single output which has an average value proportional to the power through the power line are known in the art having for example been described in U.S. Pat. No. 3,794,917. Consequently, further details are unnecessary as to the description of its operation. It might however, be preliminarily noted that most such prior art devices either provide a voltage output signal which consequently may be sent by means of outputs 28 and 30 to other portions of the circuit or they provide a single output current signal.

In this manner, pulses may be derived having an amplitude proportional to power line current and a pulse width proportional to power line voltage. These are applied in conventional circuitry to cascaded filter 42 and output amplifier 44 in order to obtain a smooth continuous average dc signal proportional to the power through the power line and to provide a high output impedance current source to apply current through some desired watt output load such as a recording or readout device or to some control system utilizing watt information connected at terminals 46 and 48.

The output 28 from the chopper modulator 41 applies the same watt related pulse train to a circuit for integrating the watt related signal with respect to time in order to provide a total energy or watthour output. Typically, this is done by an integrator-quantizer circuit 50 which consists of an integrator which integrates the pulse train analog signal from the output 28 of the chopper modulator 41 and also performs an analog to digital conversion function by quantizing the integrated signal into a series of digital pulses. These digital pulses are then counted by a pulse counter 52 consisting of, for example, suitable counting registers. It might also be noted that the power supply of applicant's system may be a relatively conventional power supply providing 5 output voltages. These voltages are +−14 volts for the op-amps, +−7 volts for the chopper modulator and a +6.2 volt reference which is derived from a zener voltage reference diode.

1. CURRENT SIGNALS

Applicant has discovered that errors due to offset voltage, drift and other voltage related errors, which detract from accuracy, can be very substantially reduced by maintaining a current signal from the modulated signal input 22 through the chopper modulator 41 all the way through the watt output load connected at terminals 46 and 48 and where watthour metering is desired through the integrator to the point where the watthour signal is converted to digital pulses. This has been done by constructing the chopper modulator, filter and output amplifier 42 and 44 and integrating quantizer 50 in such a way that a continuous current path extends through all these elements.

Essentially, this is accomplished by developing a current source from one of the input signals and connecting the watt and watthour sections in series to the output of an interposed multiplier so that the current source drives its current, which is modulated by the other input signal, through the series loads. The current path in the watt section must extend through the watt output load.

The current amplifier and filtering means is connected to the pulse width modulating switching means 41 and provides an output current at a high output impedance. This output current is proportional to the average current of the current pulses. Of course, the term "current amplifier" is used to denote an amplifier circuit having a current input and a current output with no intermediate conversion of a signal to a voltage. Thus, filtering and amplifying are accomplished with the current from the pulse width modulating switching means flowing along a current path extending through the amplifier and filter and through the output load.

If a watthour output is not desired, the single current can flow from the modulator 41 through the watt output load and return to common. However, in the case of a watt/watthour transducer, the same continuous current path must also include the integrator 50.

Applicant therefore has taken a current scaling transformer and sinks its secondary current through the watt output load through an interposed path which includes multiplying, filtering and amplifying functions. The sequential position of all these elements along the current path may be rearranged within the scope of the invention.

2. ACTIVE FILTER-CURRENT AMPLIFIER WATT OUTPUT STAGE

The improved current amplifier-filter of the present invention performs the functions of filter 42 and output amplifier 44 illustrated in FIG. 1 in one circuit with considerably fewer components than two cascaded circuits would require. Its purpose is to receive the current pulses from the chopper modulator 41, to convert those current pulses to a ripple free analog output current which is proportional to the instantaneous power through the power line and exhibit a high output impedance characteristic to the watt output load connected at terminals 46 and 48. For the reasons outlined above this current is not, at any stage in the amplifier filter, converted to a proportional voltage signal.

Figure 2:
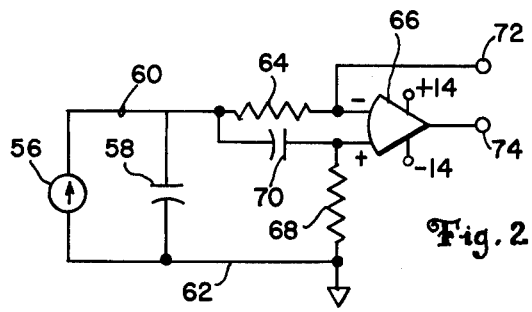
FIG. 2 is a simplified schematic diagram illustrating the improved amplifier-filter embodying the present invention.

Referring now to FIG. 2, current source 56 represents the current pulse output from the modulator 41. A first capacitance 58 is shunted across the input current source to define an input terminal 60 and a common terminal 62. A first resistance 64 connects the input terminal 60 to the inverting input of an op-amp 66. The op-amp 66 is a low bias current amplifier having a very high forward current transfer ratio and may, for example, be a type LM 308H. This op-amp has a second resistance 68 connected between its non-inverting input and the common terminal 62. A second capacitance 70 is connected to couple ripple signal from the input terminal 60 to the non-inverting input of the op-amp 66.

An output load connected between the output 74 of the op-amp and the inverting input 72 sees an effective high output impedance current source.

Conventionally, active filters are voltage devices and active filter techniques have not been applied to watt-/watthour transducers. Ordinarily, in active filters the non-inverting input is either tied directly to ground or a resistor ties the input to ground to compensate the bias current. Conventionally, the non-inverting input has no effect upon filtering.

In the present invention however, the ripple that exists on capacitor 58 at terminal 60 is injected or coupled by means of a dc blocking coupling capacitor 70 onto the non-inverting input. Consequently, both op-amp inputs are effectively making the op-amp output swing with the ripple. The result is that the voltage of both output terminals 72 and 74 are together swinging up and down above ground potential with the ripple. The ripple signal therefore does not appear in the output load connected between terminals 72 and 74.

Since the inputs of op-amp 66 are substantially at ground potential, capacitor 58 is effectively shunted by the resistance 64 thereby creating a time constant approximately equal to the resistance of resistor R64 and the capacitance of capacitance 58. This time constant determines the first pole of the two-pole active filter. The second pole is determined by capacitance 70 and resistance 68. Additional poles could be added according to known techniques.

Figure 3:
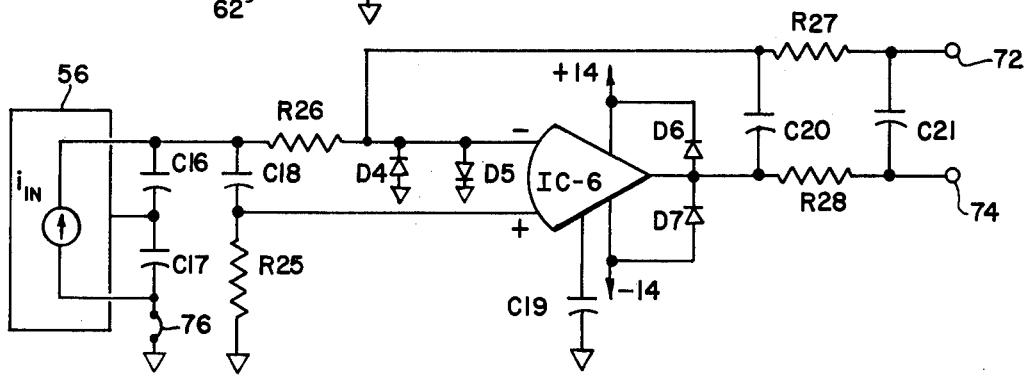
FIG. 3 is a schematic diagram of the preferred amplifier-filter circuit embodying the present invention.

FIG. 3 illustrates the preferred circuit. It might be observed that the capacitor 58 in the actual preferred embodiment of the invention comprises a pair of capacitors C16 and C17 connected to a common internal ground by a jumper 76 but this is not necessary to other embodiments. Resistors 64 and 68 of FIG. 2 correspond to resistors R26 and R25 of FIG. 3 while capacitance 70 corresponds to capacitance C18. The circuit is protected from transients by diodes D4, D5, D6 and D7. Resistors R27 and R28 as well as capacitors C20 and C21 provide additional transient protection according to conventional principles. Capacitor C19 is a conventional compensating capacitor for the op-amp. The following is a table of typical component values for the circuit of FIG. 3.

| TABLE OF TYPICAL VALUES | |
| --- | --- |
| C16 | 820 microfarads, 6 volts |
| C17 | " |
| C18 | 10 microfarads, 25 volts |
| R25 | 2.4 K ohms |
| R26 | 150 ohms |
| R27 | 470 ohms |
| R28 | " |
| C20 | .02 microfarads |
| C21 | " |
| C19 | 150 pico farads |
| D4 | 1N914 |
| D5 | " |
| D6 | " |
| D7 | " |

Applicant discloses a modulator which can provide two outputs, each appearing as an effective current source and each floating with respect to ground so that one output may be connected to the above amplifier-filter of the watt output section and the other output may be connected to the integrating quantizer of the watthour section.

Figure 4:
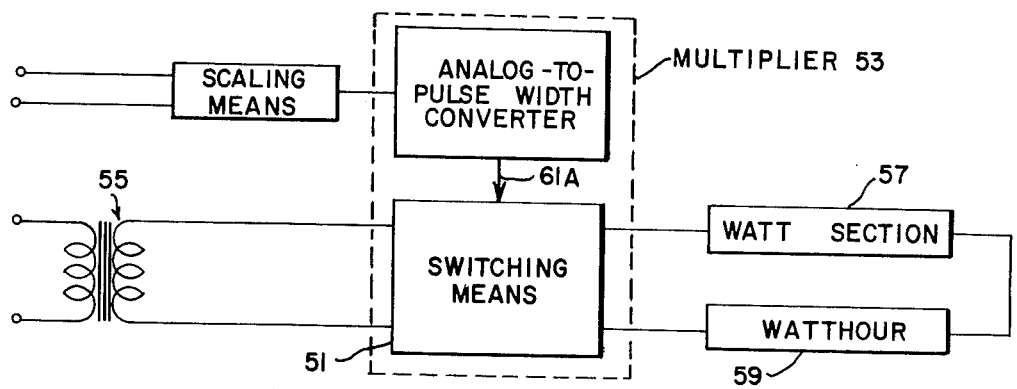
FIGS. 4 through 8 illustrate alternative pulse width modulating switching means which may be used in circuits embodying the present invention.

FIG. 4 shows a switching means 51 which includes an effective single pole double throw switching means and which is part of a multiplier 53.

The input of the switching means 51 is connected to the current transformer 55 and it has a pair of output terminals across which the series connected loads 57 and 59 are connected.

The circuits of FIGS. 5–9 illustrate alternative modulators which may be used with circuits embodying the invention.

All the alternative switching means 51a – 51c, 78 and 96 have a control input terminal 61A – 61F for switching the states of the switching means between its two states with time intervals proportional to the signal at the control port.

In all cases the switching means 51 connects at least one of the two load means 57 and 59 to the current source 55 in one state for driving current through them. In its other state the switching means 51 connects a current path across the transformer which has an impedance which is low relative to the impedance of the current transformer 55. This other state current path may or may not be through a load.

In the preferred embodiment the low impedance path is the second load means so that, preferably, the chopper modulator alternately connects each load means to the current transformer 55 as subsequently described.

Figure 5:
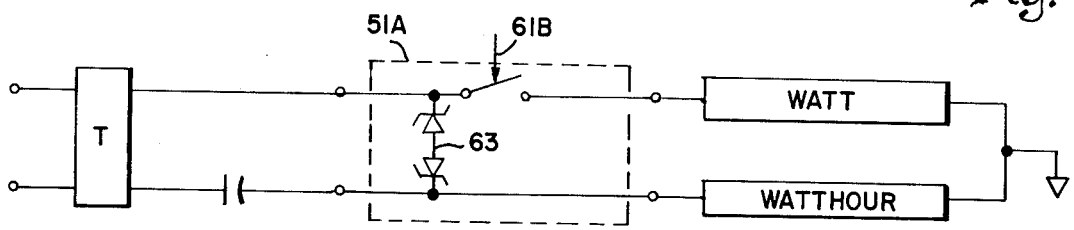
Figure 6:
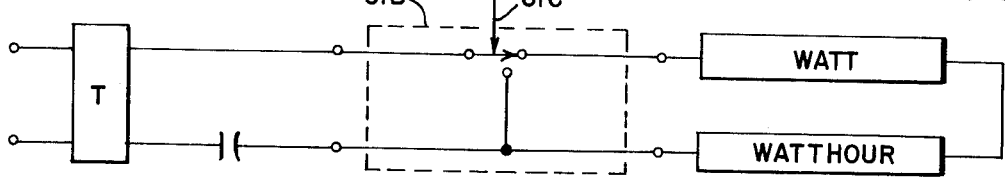

However, FIGS. 5 and 6 illustrate that in one state both impedances can be connected by the switching means to the current transformer and in the other state a zener switch can be connected across the transformer to prevent it from saturating while the load means are not connected to it. It should be noted that the zener switch 63 of FIG. 5 operates as a part of the switching means to effectively provide a second "throw" actuated by the voltage across it.

Figure 7:
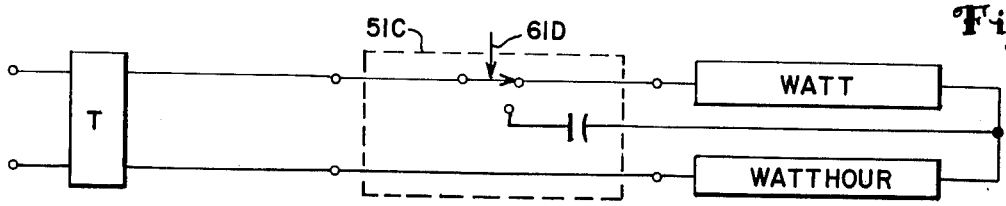

FIG. 7 illustrates that in one state both of the load means may be connected while one is connected in the other state. All of the circuits provide a single DC current path around a loop which includes the load means.

Figure 8:
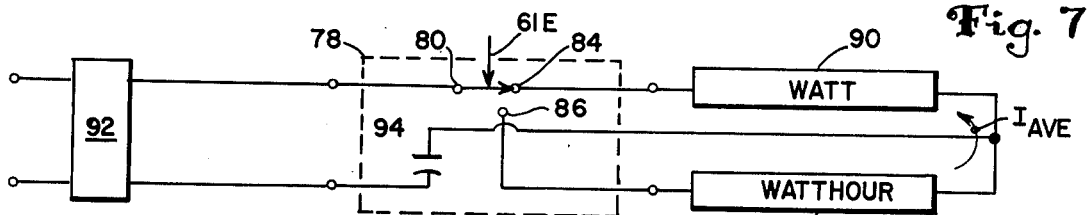

FIG. 8 illustrates another alternative modulator which may be used with applicant's invention. The circuit has a single pole, double throw electronic switching means 78 having a wiper terminal 80, a control port 61E for switching the switching means 78 and a pair of output terminals 84 and 86 which are alternatively connectable by the switching means 78 to the wiper terminal 80. Since the circuit deals with current signals it is important that the switching means have no substantial interterminal leakage including none from the control input 61 E.

A pair of output loads 88 and 90 have one terminal of each connected to a common ground and the other terminal of each connected to a different one of the output terminals 84 and 86 of the switching means 78. The secondary of the current transformer 92 of the current scaling means 10 illustrated in FIG. 1, is coupled to the wiper terminal 80 for at times driving current through the loads 88 and 90 depending upon the state of the switchng means 78. However, at least one dc blocking capacitance 94 is connected in the coupling path from the modulated signal source means 92 to the loads 88 and 90 to maintain a zero average current flow through the modulated source means 92.

Finally, a modulating signal source means is connected to the control port 61E for switching the switching means 78 in accordance with the input modulating signal. In the preferred embodiment of the invention, the modulating signal is applied through output 40 of comparator 38 illustrated in FIG. 1.

The modulating signal is, of course, a signal for switching the switching means 78 between its two states. The modulating signal utilized in the preferred embodiment of the invention is a series of pulses each pulse having a pulse width proportional to the amplitude of the voltage from the voltage scaling means 16 of FIG. 1.

As the switching means 78 is alternatively switched by the modulating signal between its two states, the modulated signal source means 92 alternatively applies periodic current pulses to the loads 88 and 90. Because of the placement of the dc blocking capacitance 94 in series with the modulated signal source means 92, the average current through the source means 92 must be zero. However, the average current flow through the loads 88 and 90 is not so constrained and these loads will carry an identical average current $I_{ave}$ because they provide the only paths for such an average current to flow.

Consequently, considering the load 90 for example, this load will see current pulses having an instantaneous amplitude equal to the instantaneous amplitude of the modulated signal source means 92 and having a pulse width equal to the pulse width of the modulating signal at the control port 61E. As explained previously, the average value of these pulses is equal to the product of the voltage and current in the power line and consequently is proportional to the power of the power line.

The average current flowing in the load 88 must be identical to the average current in the load 90 since the load 88 provides the only path by which the average current through the load 90 can be returned to ground. Consequently, one of the loads appears to be functioning as a source of average current proportional to the power of the power line and of the other load appears to be a sink for an exactly identical current.

Figure 9:
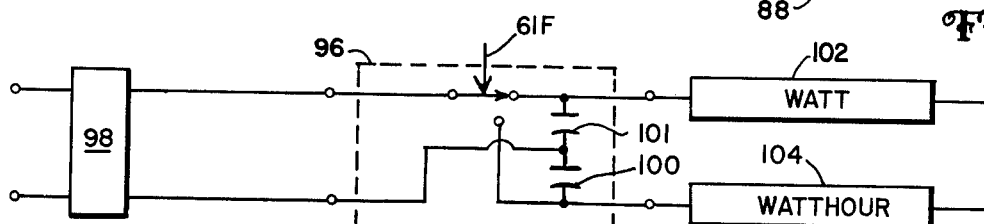
FIG. 9 is a diagram illustrating the preferred switching means for use with an embodiment of the present invention.

FIG. 9 illustrates a circuit embodying the concepts of the circuit of FIG. 8 but shows a configuration which is preferred for use in applicant's watt/watthour transducer. The circuit of FIG. 9 has a switching means 96 and a modulating signal source means 98 which preferably is the secondary of the current transformer located in the current scaling means 10.

However, in this circuit a pair of filtering capacitances 100 and 101 are series connected across the output terminals of the switching means 96 and have one terminal of the modulating signal of the source means 98 connected intermediate these capacitances. The capacitances 100 and 101 provide not only filtering of the output but additionally provide the average current blocking function which was provided by capacitance 94 in FIG. 8.

One of the output terminals of the modulator of FIG. 9 is connected to the watt output amplifier and filter 102 which is one effective modulator output load and the other output of the modulator is connected to the integrator quantizer 104 of the watthour section which is another effective modulator output load.

The watt output section 102 is the amplifier-filter circuit illustrated in FIG. 3. Referring to FIG. 3, the capacitances C16 and C17 of FIG. 3 are identically the capacitances 101 and 100 of FIG. 9. However, the jumper 76 of FIG. 3 would be removed and its two terminals are the terminals to which the watthour integrator-quantizer 104 is connected.

It is to be understood that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

What is claimed is:

1. An electrical power line power metering apparatus comprising:
   a. input scaling means connected to a power line and including a current input means and a voltage input means for providing electrical signals proportional to the instantaneous voltage and current of said power line, at least one of said input means being a high impedance current source;
   b. a multiplier means connected to said input scaling means and having no substantial current path shunting the modulated current, for pulse width modulating the current from said high impedance current source with the signal from the other of said input means to provide output current pulses having an instantaneous amplitude substantially equal to the amplitude of the instantaneous signal from said high impedance current source and having a pulse width proportional to the instantaneous amplitude of the other of said signals;
   c. a first capacitance shunted across the output of said multiplier means;
   d. an op-amp having a high forward current transfer ratio and having an inverting input and a non-inverting input;
   e. a first resistance connecting a first output terminal of said multiplier means to said inverting input;
   f. a second dc blocking capacitor connected for coupling ripple signal at said first output terminal to said non-inverting input; and
   g. a second resistance connected between said noninverting input and the other output terminal of said multipler means;
      wherein the average current through an impedance connected between the inverting input and the output of the op-amp is proportional to the electrical power flow through said power line.

2. An apparatus according to claim 1 wherein a watt-hour integrator section is serially interposed between said second resistance and said other output terminal of said multiplier means.

3. An apparatus according to claim 1 wherein said high impedance current source comprises the secondary of a current scaling transformer operating as said current input means.

4. An electrical power line power metering apparatus comprising:
   a. input scaling means connected to a power line and including a current input means and a voltage input means for providing electrical signals proportional to the instantaneous voltage and current of said power line, at least one of said input means being a high impedance current source;
   b. a multiplier means connected to said input scaling means and having no substantial current path shunting the modulated current, for pulse width modulating the current from said high impedance current source with the signal from the other of said input means to provide output current pulses having an instantaneous amplitude substantially equal to the amplitude of the instantaneous signal from said high impedance current source and having a pulse width proportional to the instantaneous amplitude of the other of said signals;
   c. a dc current amplifier comprising a differential input op-amp having its inverting input coupled to the output of said multiplier means, having a dc blocking capacitance connected between its non-inverting input and its inverting input for coupling ripple from the output of said multiplier means to said non-inverting input; and
   d. an output impedance connected between the inverting input and the output of the op-amp;
      whereby a substantially non-shunted current path is provided serially through said high impedance current source and said output impedance and wherein the average of the current along said path is proportional to the electrical power flow through said power line.

5. A power transducer for providing an output current through an output load which is proportional to the power through a power line, said transducer comprising:
   a. input scaling means connected to a power line and including a current input means and a voltage input means for providing electrical signals proportional to the instantaneous voltage and current of said power line, at least one of said input means being a high impedance current source;
   b. a multiplier means connected to said input scaling means and having no substantial current path shunting the modulated current, for pulse width modulating the current from said high impedance current source with the signal from the other of said input means to provide output current pulses having an amplitude substantially equal to the amplitude of the instantaneous signal from said high impedance current source and having a pulse width proportional to the amplitude of the other of said signals;
   c. a dc current amplifier having no substantial current path shunting the modulated current and having its input coupled to the output of said multiplier means; and
   d. a current conducting path serially including said output load and connected across the output of said dc current amplifier and having no substantial intermediate current shunting path;
      whereby a substantially non-shunted current loop is provided serially through said high impedance current source and said output load and wherein the current along said path is proportional to the electrical power flow through said power line.

6. A power transducer according to claim 5 wherein said dc current amplifier comprises a differential input op-amp having its inverting input as the input of the dc amplifier and having resistances series connected to said output load.

* * * * *

UNITED STATES PATENT OFFICE
CERTIFICATE OF CORRECTION

Patent No. 4,055,804          Dated October 25, 1977

Inventor(s) Glenn A. Mayfield

It is certified that error appears in the above-identified patent and that said Letters Patent are hereby corrected as shown below:

On the first page the assignee of record should be shown as follows:

Assignee: Esterline Corporation, New York, N.Y.

Signed and Sealed this

Twenty-eighth Day of February 1978

[SEAL]

*Attest:*

RUTH C. MASON
*Attesting Officer*

LUTRELLE F. PARKER
*Acting Commissioner of Patents and Trademarks*